United States Patent
Tan

(10) Patent No.: US 10,020,029 B1
(45) Date of Patent: Jul. 10, 2018

(54) VOLTAGE SCALING-UP CIRCUIT AND BULK BIASING METHOD THEREOF

(71) Applicant: PixArt Imaging (Penang) SDN. BHD., Penang (MY)

(72) Inventor: Kok-Siang Tan, Penang (MY)

(73) Assignee: PixArt Imaging (Penang) SDN. BHD., Penang (MY)

( * ) Notice: Subject to any disclaimer, the term of this patent is extended or adjusted under 35 U.S.C. 154(b) by 0 days.

(21) Appl. No.: 15/477,519

(22) Filed: Apr. 3, 2017

(51) Int. Cl.
| | |
|---|---|
| G05F 3/02 | (2006.01) |
| H02M 3/07 | (2006.01) |
| G11C 5/14 | (2006.01) |
| H02M 3/137 | (2006.01) |
| H02M 3/158 | (2006.01) |

(52) U.S. Cl.
CPC ............ *G11C 5/145* (2013.01); *G11C 5/147* (2013.01); *H02M 3/073* (2013.01); *H02M 3/137* (2013.01); *H02M 3/1584* (2013.01); *H02M 2003/076* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,418,040 B1* | 7/2002 | Meng | ........................ | F28D 5/00 307/109 |
| 7,696,812 B2* | 4/2010 | Al-Shamma | .......... | H02M 3/073 327/536 |
| 9,634,559 B2* | 4/2017 | Kim | ........................ | H02M 3/07 |

* cited by examiner

*Primary Examiner* — An Luu
(74) *Attorney, Agent, or Firm* — Tung & Associates

(57) ABSTRACT

The present invention provides a voltage scaling-up circuit which comprises a charge pump circuit and a multiplexer circuit. The charge pump circuit which includes at least one pumping switch, and is configured to operably periodically converts an input voltage to a pumped voltage onto a pump output node through the at least one pumping switch by charging and pumping, such that the pumped voltage has a scaling factor over the input voltage, wherein the at least one pumping switch has a bulk. The multiplexer circuit senses a predetermined voltage and the pumped voltage and selects one of the predetermined voltage and the pumped voltage which has a higher magnitude as a scaled output voltage at a scaled output node; wherein the bulk of the at least one pumping switch is biased to the scaled output voltage.

10 Claims, 3 Drawing Sheets

US 10,020,029 B1

VOLTAGE SCALING-UP CIRCUIT AND BULK BIASING METHOD THEREOF

BACKGROUND OF THE INVENTION

Field of Invention

The present invention relates to a charge pump circuit; particularly, it relates to a charge pump with bulk biasing circuit. The present invention also relates to a bulk biasing circuit and a bulk biasing method of the charge pump.

Description of Related Art

A prior art cross-coupled charge pump (charge pump 1) is shown in FIG. 1. The prior art cross-coupled charge pump converts an input voltage VDD to an output voltage VOUT. Operating by clock signals CK1 and CK2 which are of opposite phase to each other, charges are periodically pumped through the NMOS transistors M1 and M2 to pumping nodes PN1 and PN2 at which the voltages VPN1 and VPN2 can be higher than the input voltage VDD. The voltages VPN1 and VPN2 are then transferred to the output voltage VOUT, wherein in steady state the output voltage VOUT will be substantially 2*VDD. A drawback of the prior art charge pump 1 is that, because the bulk of the PMOS transistor (M3 or M4) is biased at the output voltage VOUT, there could be a current flowing from the input voltage to the bulk of the PMOS transistors when the output voltage VOUT is below a voltage level of (VDD-Vthp) (wherein Vthp is the threshold voltage of the parasitic diode of PMOS transistor M3 or M4), for example when the voltage VOUT is ramping from 0V toward its target during power-on start-up. To solve this problem, one solution is to dynamically connect the bulk of the PMOS transistors M3 and M4 to a higher voltage level, but this solution involves a complicated circuit.

Another drawback of the prior art shown in FIG. 1 is that if the output capacitor COUT in FIG. 1 is an external capacitor, the capacitance of the COUT could be relatively large, and it could take a relatively longer time to charge the capacitor COUT from 0V to the target of the output voltage VOUT.

Besides the fact that the longer settling time of the output voltage VOUT may delay the system to start normal operations (for example when the output voltage VOUT is providing power to start up a load circuit 30), the longer settling time could also lead to potential leak current to one or more devices (not shown) within the load circuit 30 for a reason similar to the above. For example, if the load circuit 30 includes another supply voltage in addition to the output voltage VOUT, there could be an undesired leakage current flowing from this supply voltage reversely to the output voltage VOUT and to the charge pump 1.

FIG. 2 shows another prior art cross-coupled charge pump (charge pump 2, "A High-Efficiency CMOS Voltage Doubler", Pierre Favrat, P. Deval, Michel Declercq, Journal of Solid State Circuit 1998). The charge pump 2 includes an auxiliary charge pump formed by cross-coupled transistor pair M5 and M6 and a capacitor CB to provide a pumped bias voltage VB for biasing the bulk of all the PMOS transistors M3-M6. The capacitance of the capacitor CB is relatively smaller than COUT since the capacitor CB needs only to bias the bulk of the PMOS transistors. Hence, the settling time of the pumped bias voltage VB can be much faster than the output voltage VOUT. Though the charge pump 2 assures that the bulks of the PMOS transistors are all biased to a higher voltage level, the issues of the longer settling time and the potential leakage current within the load circuit 30 are still not solved.

Compared to the prior art in FIG. 1, the present invention has an advantage that the bulks of all the PMOS transistors are automatically biased to the higher voltage level without delay. Compared to the prior art circuits in FIGS. 1 and 2, the present invention has an advantage that the settling time of the pumped voltage can be shortened, so as to speed up the power-on process of the system and avoiding the potential leakage current problem.

SUMMARY OF THE INVENTION

From one perspective, the present invention provides a voltage scaling-up circuit, comprising: a charge pump circuit which includes at least one pumping switch, and is configured to periodically store charges in at least one charge storage device therein according to an input voltage, and pumps the charges stored in the at least one charge storage device to a pumped voltage onto a pump output node through the at least one pumping switch, such that the magnitude of the pumped voltage is higher than the magnitude of the input voltage with a scaling factor, wherein each of the at least one pumping switch has a bulk; and a multiplexer circuit, configured to operably select one of a predetermined voltage and the pumped voltage which has a higher magnitude as a scaled output voltage at a scaled output node which is coupled to a first terminal of a scaled output capacitor; wherein the bulk of the at least one pumping switch is connected to the scaled output node, such that the bulk of the at least one pumping switch is biased to the scaled output voltage.

In one embodiment, the multiplexer circuit includes a selection circuit and a comparison circuit, wherein the comparison circuit is configured to compare the predetermined voltage and the pumped voltage to generate a comparison result, and the selection circuit selects one of the predetermined voltage and the pumped voltage which has the higher magnitude as the scaled output voltage at the scaled output node according to the comparison result.

In one embodiment, the voltage scaling-up circuit of claim 2, wherein the comparison circuit and the selection circuit include and share an operation device, wherein the comparison result of the comparison circuit is implied by an operation state of the operation device.

In one embodiment, the charge pump circuit further includes a first charge storage device, a second charge storage device, a first charging transistor, and a second charging transistor, wherein each of the first and the second charging transistors includes a control terminal and a channel having a channel input terminal and a channel output terminal; wherein the at least one pumping switch includes a first and a second pumping transistors, wherein each of the first and the second pumping transistors includes a control terminal, a channel having a channel input terminal and a channel output terminal, and a bulk; wherein a first terminal of the first charge storage device is electrically connected to a first clock signal, and a first terminal of the second charge storage device is electrically connected to a second clock signal, and a second terminal of the first charge storage device is connected to a first pumping node at which a first charged voltage is presented, and a second terminal of the second charge storage device is connected to a second pumping node at which a second charged voltage is presented, and the channel input terminals of the first and the second charging transistors are electrically connected together to the input voltage, and the channel output terminals of the first and the second charging transistors are electrically connected to the first pumping node and the second pumping node respectively, and the control terminals of the first and the second charging transistors are electrically connected to the second pumping node and the first pumping node respectively; wherein the channel output terminals of the first and the second pumping transistors are electrically connected together to the pump output node, and the channel input terminals of the first and the second pumping transistors are electrically connected to the first pumping node and the second pumping node respectively, and the control terminals of the first and the second pumping transistors are electrically connected to the second pumping node and the first pumping node respectively; wherein the first and the second clock signals provide periodical pulsating voltages, and one of the channels of the first and the second charging transistors which has a higher control terminal voltage magnitude is conductive, such that the first and the second charged voltages are charged and pumped to pulsate between the input voltage level and the input voltage level plus the peak to peak level of the first and the second clock signals respectively, wherein the first and the second clock signals are substantially out of phase with each other, and the first and the second charged voltages correspondingly are substantially out of phase with each other; wherein one of the channels of the first and the second pumping transistors which has a lower control terminal voltage magnitude is conductive, such that one of the first and the second charged voltages which has a higher magnitude is electrically connected to the pump output node through the conductive channel.

In one embodiment, the first charge storage device includes a capacitor or a MOS capacitor, and the second charge storage device includes a capacitor or a MOS capacitor.

In one embodiment, amplitudes of the first and the second clock signals have substantially the same magnitude as the input voltage.

In one embodiment, the predetermined voltage level is substantially the same as the input voltage level.

In one embodiment, the scaled output voltage is supplied to a load circuit, wherein the multiplexer circuit senses the predetermined voltage and the pumped voltage and selects one of the predetermined voltage and the pumped voltage which has a higher magnitude as the scaled output voltage to prevent a reverse current from flowing from the load circuit to the voltage scaling-up circuit through the scaled output voltage.

In one embodiment, each of the at least one pumping switch is a MOSFET.

From another perspective, the present invention provides a bulk biasing method for use in a charge pump circuit, the charge pump circuit including at least one pumping switch, configured to operably periodically store charge on at least one charge storage device according to an input voltage, and pump the charge stored in the at least one charge storage device to a pump output node through the at least one pumping switch, such that the magnitude of the pumped voltage is higher than the magnitude of the input voltage with a scaling factor, wherein each of the at least one pumping switch has a bulk; the bulk biasing method comprising: sensing a predetermined voltage and the pumped voltage; selecting one of the predetermined voltage and the pumped voltage which has a higher magnitude as a scaled output voltage at a scaled output node; and connecting a bulk of the at least one pumping switch to the scaled output node.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 3:
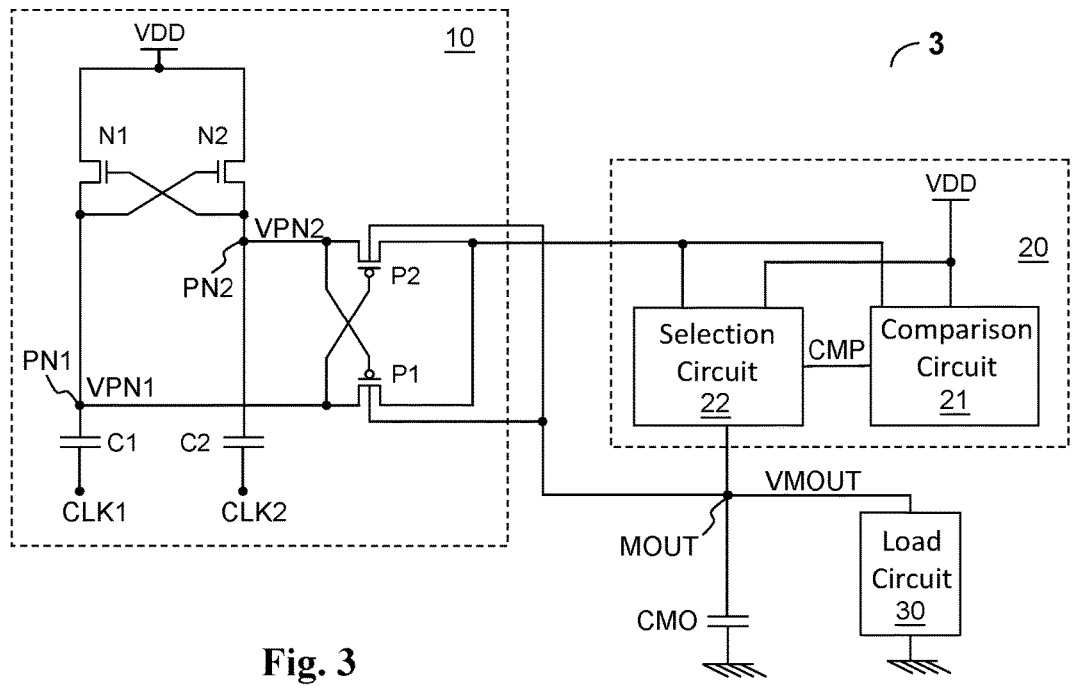
FIG. 3 shows a block diagram of an embodiment of the voltage scaling circuit according to the present invention.

FIG. 3 shows one preferred embodiment of the voltage scaling-up circuit according to the present invention (voltage scaling-up circuit 3). The voltage scaling-up circuit 3 comprises a charge pump circuit 10 and a multiplexer circuit 20, and is for use in converting an input voltage VDD to a scaled output voltage VMOUT at a scaled output node MOUT for supplying power to a load circuit 30, wherein a scaled output capacitor CMO is coupled to the scaled output node MOUT for charge storage and voltage filtering.

The charge pump circuit 10 includes a first pumping capacitor C1, a second pumping capacitor C2, a first charging transistor N1, a second charging transistor N2, and a first and a second pumping transistors P1 and P2. Each of the first and the second charging transistors N1 and N2 includes a control terminal and a channel having a channel input terminal and a channel output terminal, and each of the first and the second pumping transistors P1 and P2 includes a control terminal, a channel having a channel input terminal and a channel output terminal, and a bulk.

A first terminal of the first pumping capacitor C1 is electrically connected to a first clock signal CLK1, and a first terminal of the second pumping capacitor C2 is electrically connected to a second clock signal CLK2, and a second terminal of the first pumping capacitor C1 is connected to a first pumping node PN1 at which a first charged voltage VPN1 is presented, and a second terminal of the second pumping capacitor C2 is connected to a second pumping node at which a second charged voltage VPN2 is presented.

Note that in other embodiments, the pumping capacitors may be any kinds of charge storage devices, such as a MOSFET (Metal-Oxide-Silicon Field Effect Transistor) configured as a capacitor (e.g. drain and source terminals of the MOSFET are connected together as one terminal of the MOSFET capacitor), or a MOSCAP (Metal-Oxide-Silicon Capacitor) formed by bulk and gate materials (e.g. metal or polysilicon).

Still referring to FIG. 3, the channel input terminals of the first and the second charging transistors N1 and N2 are electrically connected together to the input voltage VDD, and the channel output terminals of the first and the second charging transistors N1 and N2 are electrically connected to the first pumping node PN1 and the second pumping node PN2 respectively, and the control terminals of the first and the second charging transistors N1 and N2 are electrically connected to the second pumping node PN2 and the first pumping node PN1 respectively.

The channel output terminals of the first and the second pumping transistors P1 and P2 are electrically connected together to the pump output node PO, and the channel input terminals of the first and the second pumping transistors P1 and P2 are electrically connected to the first pumping node PN1 and the second pumping node PN2 respectively, and the control terminals of the first and the second pumping transistors P1 and P2 are electrically connected to the second pumping node PN2 and the first pumping node PN1 respectively.

The first and the second clock signals CLK1 and CLK2 provide periodical pulsating voltages with a pumping frequency, wherein each of the first and the second clock signals CLK1 and CLK2 has a peak to peak voltage, wherein the peak to peak voltage has a magnitude of VPP. One of the channels of the first and the second charging transistors N1 and N2 which has a higher control terminal voltage magnitude is conductive, such that a first and a second charged voltages VPN1 and VPN2 are generated onto the first and the second pumping node PN1 and PN2 respectively, wherein each of the first and the second charged voltages VPN1 and VPN2 pulsates from VDD to (VDD+VPP).

In one preferred embodiment, the magnitude of the peak to peak voltage VPP is substantially the same as the magnitude of VDD, thus the each of the first and the second charged voltages VPN1 and VPN2 pulsates from VDD to 2*VDD in this embodiment.

In one preferred embodiment, the first and the second clock signals are substantially out of phase with each other, and therefore the first and the second charged voltages correspondingly are also substantially out of phase with each other.

Still referring to FIG. 3, one of the channels of the first and the second pumping transistors P1 and P2 which has a lower control terminal voltage magnitude is conductive, such that one of the first and the second charged voltages VPN1 and VPN2 which has a higher magnitude is electrically connected to the pump output node PO through the conductive channel for generating a pumped voltage VPO onto the pump output node PO.

Note that in other embodiments, the charge pump circuit 10 may include a pump output capacitor (not shown) which is connected to the pump output node PO to store the charges and to maintain the level of the pumped voltage VPO pumped from the first and the second charged voltages VPN1 and VPN2.

Still referring to FIG. 3, in this embodiment, the multiplexer circuit 20 includes a comparison circuit 21 and a selection circuit 22, wherein the comparison circuit 22 is configured to compare the predetermined voltage (e.g. VDD) and the pumped voltage VPO to generate a comparison result (for example CMP as shown in the figure), and the selection circuit 22 selects one of the predetermined voltage and the pumped voltage VPO which has the higher magnitude as the scaled output voltage VMOUT at the scaled output node MOUT according to the comparison result. And therefore the scaled output voltage VMOUT substantially keeps at the level which has the higher magnitude between the input voltage VDD and the pumped voltage VPO. The bulks of the first and the second pumping transistors P1 and P2 are connected to the scaled output node MOUT, such that the bulks of the first and the second pumping transistors P1 and P2 are biased at the scaled output voltage VMOUT. In this embodiment, the scaled output voltage VMOUT is configured to achieve substantially 2*VDD in steady state.

In this embodiment according to the present invention, since the scaled output voltage VMOUT substantially keeps at the level which has the higher magnitude between the input voltage VDD and the pumped voltage VPO, and the bulks of the first and the second pumping transistors P1 and P2 are biased at the scaled output voltage VMOUT, several advantages over prior art circuits are achieved.

Figure 1:
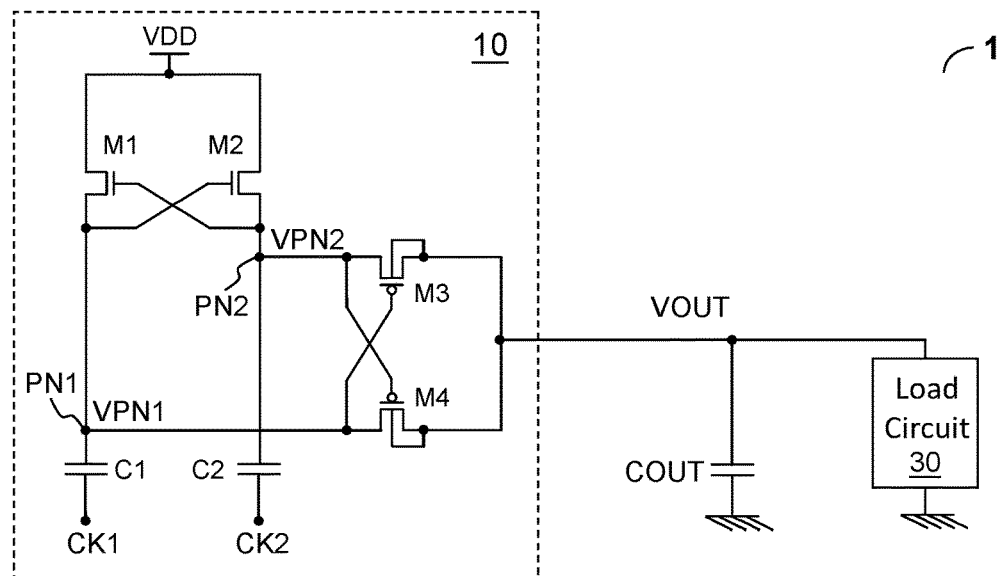
FIG. 1 shows a schematic diagram of a prior art cross-coupled charge pump.
Figure 2:
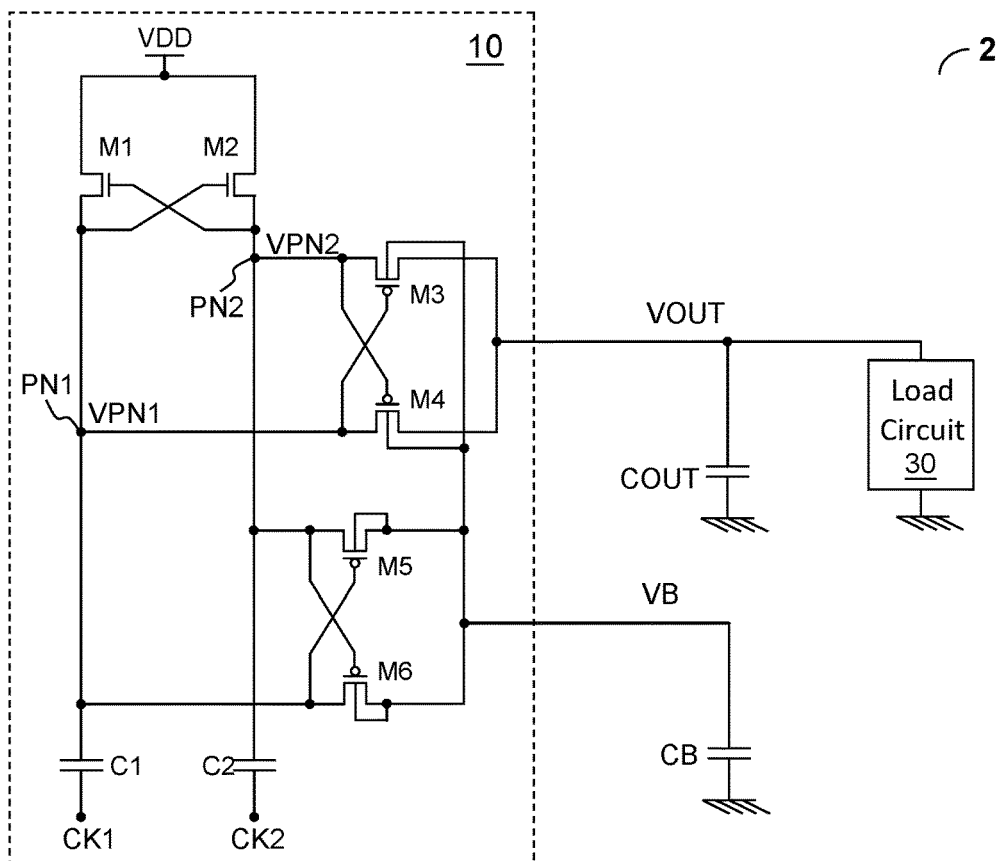
FIG. 2 shows a schematic diagram of a prior art cross-coupled charge pump.
Figure 4:
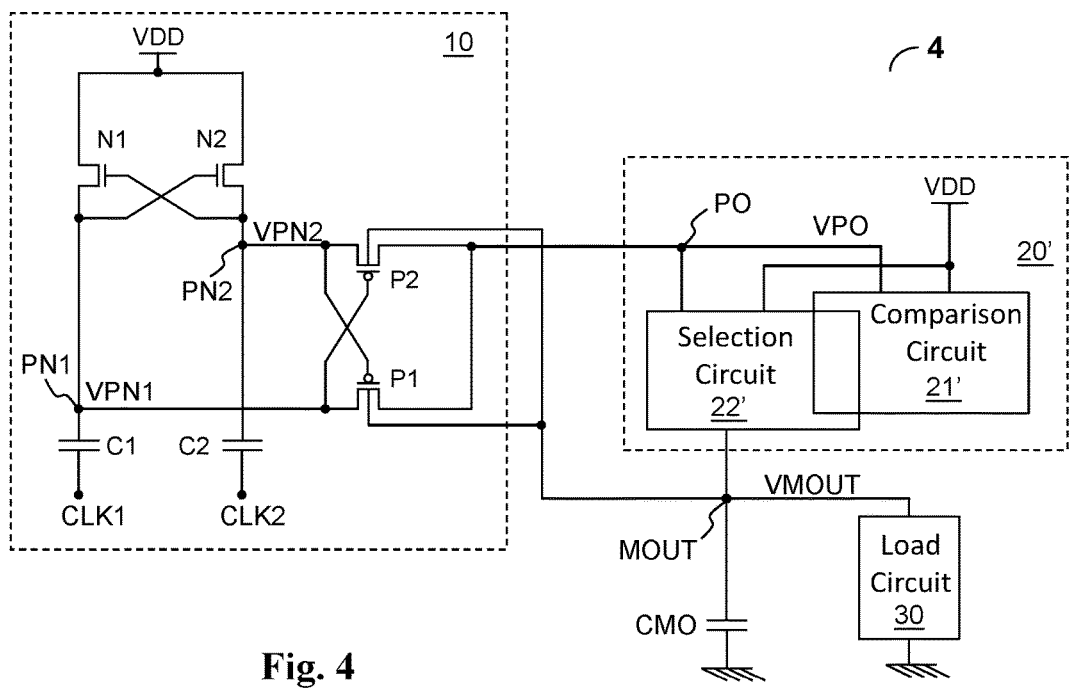
FIG. 4 shows a block diagram of an embodiment of the voltage scaling circuit according to the present invention.
Figure 5:
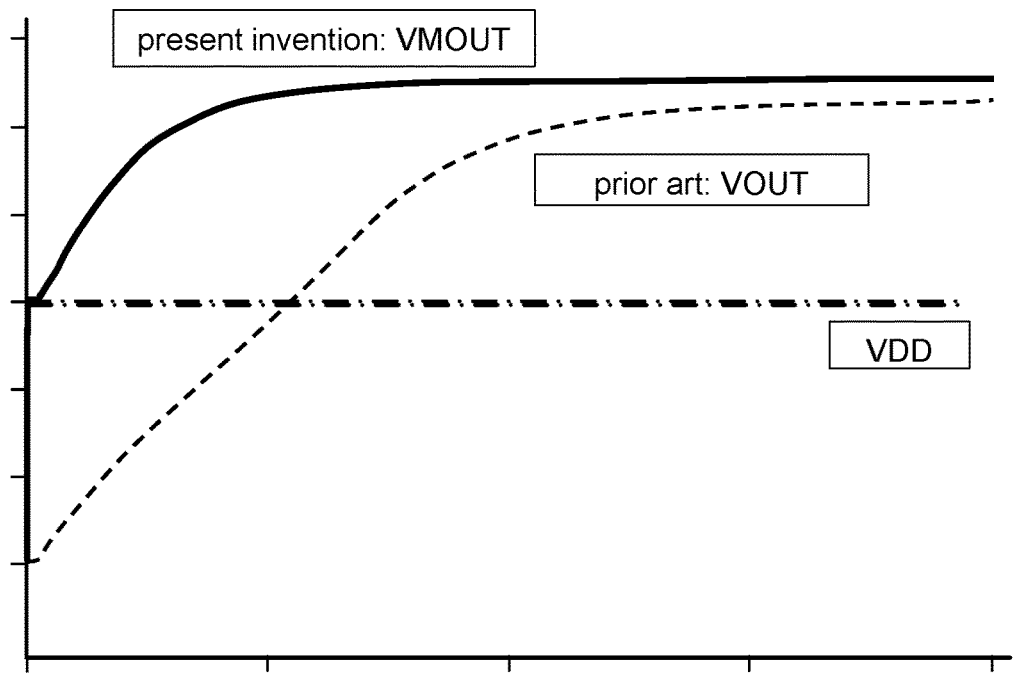
FIG. 5 shows simulation waveforms of the circuits of the prior art shown in FIG. 1 and of the present invention shown in FIGS. 3 and 4.
Figure 6:
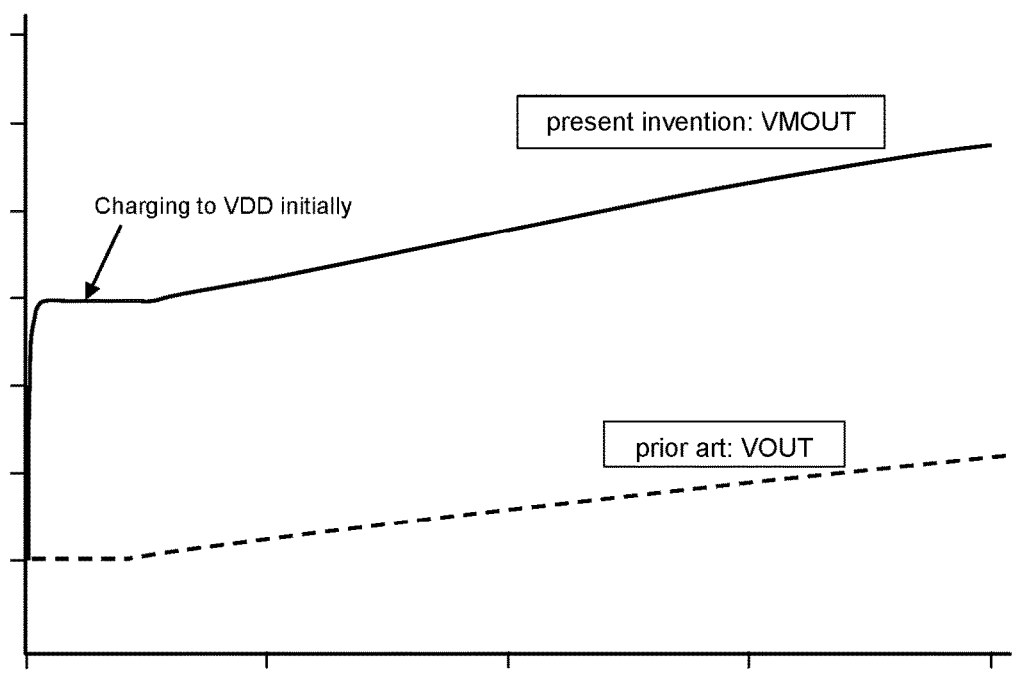
FIG. 6 shows zoomed-in simulation waveforms during powering up corresponding to FIG. 5.

First, the ramping up time of the scaled output voltage VMOUT according to the present invention is much shorter than prior art. Referring to FIG. 5 which shows simulation waveforms of the prior art (e.g. the prior art cross-coupled charge pump 1 as shown in FIG. 1) and of the embodiments according to the present invention (e.g. the voltage scaling-up circuits 3 and 4 as shown in FIGS. 3 and 4), wherein the output capacitor COUT (of the prior art 1) and the scaled output capacitor CMO of the present invention have the same capacitance and are both relatively large, the output voltage VOUT (the dash line of FIG. 5) of the prior art cross-coupled charge pump 1 is slowly charged and pumped from 0V to substantially 2*VDD. Compared to the waveform VOUT of the prior art, the waveform of the scaled output voltage VMOUT (the solid line shown in FIG. 5) of the present invention is charged to VDD in a relatively very short time from 0V at the beginning of the ramping up first, and then charged and pumped substantially to 2*VDD. Therefore the total ramping up time from 0V to 2*VDD of the voltage scaling-up circuit 3 of the present invention is much shorter as compared to the prior art cross-coupled charge pump 1. Also referring to FIG. 6 which shows zoomed-in simulation waveforms during the power-up stage corresponding to FIG. 5, VMOUT is more clearly shown as being charged to VDD level almost instantly and then continuing being charged towards its target.

Note that the term "substantially" such as in the aforementioned "substantially 2*VDD" means that though the target scaled output voltage VMOUT is configured to be pumped to 2*VDD, due to circuit performance limits for example but not limited to leakage current, switching loss, parasitic resistance, load current effect and etc., the actual scaled output voltage VMOUT may not be exactly 2*VDD, the same for other uses of the term "substantially".

Second, the leakage current problem of for example the bulk parasitic diodes of the pumping transistors (for example bulk-drain or bulk-source diodes of P1 and P2 in the embodiment as shown in FIG. 3) can be mitigated according to the present invention. Since the bulks of the first and the second pumping transistors P1 and P2 are biased at the scaled output voltage VMOUT which is charged to VDD in the beginning of the ramping up, the time window for the leakage current to occur is much shorter as compared to the prior art, even with a relatively larger scaled output capacitor CMO. As a comparison, in the prior art charge pump 1, when the input voltage VDD (the double dash line shown in FIG. 5) is higher than the output voltage VOUT at the beginning of the power-on ramping up, a large leakage current may occur and hence the current consumption is large. Also note that: since the leakage current of the voltage scaling-up circuit of the present invention is mitigated and so is the efficiency of the power conversion from the input voltage VDD to the scaled output voltage VMOUT, the final level of the scaled output voltage VMOUT according to the present invention is closer to the target than the VOUT of the prior art as shown in FIG. 5.

Third, a reverse current from the load circuit 30 (e.g. the load circuit 30 in FIG. 3) to the voltage scaling-up circuit through the scaled output voltage can be prevented since the multiplexer circuit (e.g. the multiplexer circuit 20 in FIG. 3) senses a predetermined voltage (e.g. VDD) and the pumped voltage VPO and selects one of the predetermined voltage and the pumped voltage which has a higher magnitude as the scaled output voltage VMOUT. In one embodiment, the load circuit (e.g. the load circuit 30 in FIG. 3) may include an auxiliary supply (e.g. VDD, not shown) in addition to the scaled output voltage VMOUT, and the load circuit 30 may include a parasitic or a non-parasitic device such as a diode or a transistor (not shown) which is configured to operate according to the scaled output voltage VMOUT which is supposed to be higher than the auxiliary supply. In this case, the aforementioned reverse current may occur when the scaled output voltage VMOUT is lower than the auxiliary supply by a significant voltage difference. In one embodiment, the predetermined voltage for the multiplexer circuit to select from is related to the auxiliary supply of the load circuit. As a comparison, in the prior art charge pump 1 or 2, when the output capacitor COUT is large and leads to longer settling time than an auxiliary supply (not shown) of the load circuit 30, the aforementioned reverse current may occur. However, such reverse current can be effectively prevented in the scaling-up circuit of the present invention as described above because the scaled output voltage VMOUT are always substantially equal to one of the pre-determined voltage and the pumped voltage which has a higher magnitude.

Note that the present invention is not limited to using VDD as the predetermined voltage as one of the candidates for the multiplexer circuit 20 to select from. In another embodiment, the multiplexer circuit (e.g. the multiplexer circuit 20 of the embodiment as shown in FIG. 3) according to the present invention may selects and conducts the higher between a predetermined voltage other than VDD and the pumped voltage VPO to the scaled output voltage VMOUT. In one embodiment, the predetermined voltage is related to the aforementioned second supply of the load circuit (e.g. load circuit 30 as shown in FIG. 3). And, the "predetermined voltage" may be a fixed voltage or an adjustable variable voltage.

Referring to FIG. 4, in one embodiment which is similar with the embodiment shown in FIG. 3 but different in that the comparison circuit 21' and the selection circuit 22' of the multiplexer circuit 20' of the present invention may include and share an operation device (not shown), wherein the aforementioned comparison result of the comparison circuit 21' is implied by an operation state of the operation device.

Note that the charge pump circuit of the voltage scaling-up circuit is not limited to the embodiment as shown in FIG. 3 (charge pump circuit 10), wherein the charge pump circuit 10 is referred to as a voltage doubler which converts the input voltage VDD to the pumped voltage with a target level of 2*VDD. In other embodiments, other than a scaling factor of 2, the target magnitude of the pumped voltage may be the input voltage magnitude scaled by a scaling factor greater than 1.

In one embodiment, the voltage scaling circuit according to the present invention may include other kinds of charge pump circuits instead, as long as it provides benefits to bias a bulk of the charge pump circuitry to one of the predetermined voltage and the pumped voltage which has the higher magnitude and/or it provides benefits to pre-charge the scaled output voltage to the predetermined voltage as mentioned above.

Still referring to FIG. 3, in one embodiment, the charge pump circuit (e.g. the charge pump circuit 10) of the voltage scaling-up circuit (e.g. the voltage scaling-up circuit 3) includes at least one pumping switch (e.g. the pumping transistors P1 or P2), and is configured to operably periodically store charge in at least one charge storage device (e.g. the pumping capacitor C1 or C2) therein according to an input voltage (e.g. VDD), and pumps the charge stored in the at least one charge storage device to a pumped voltage (e.g. VPO) onto a pump output node (e.g. PO) through the at least one pumping switch, such that the magnitude of the pumped voltage is higher than the magnitude of the input voltage with a scaling factor (e.g. 2*VDD), wherein each of the at least one pumping switch has a bulk (e.g. the bulk of the pumping transistors P1 or P2), and wherein the bulk of the at least one pumping switch is electrically connected to the scaled output node (e.g. MOUT) of the voltage scaling-up circuit.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. As an example, the magnitude of the clock signals in the aforementioned above may be a value different from VDD and the magnitude of the predetermined voltage may be another different value other than VDD at the same time. Furthermore, those skilled in this art can readily conceive variations and modifications within the spirit of the present invention. For example, the P and N type MOS transistors in the aforementioned can be replaced by their complementary types of MOS transistors to form for example a voltage scaling circuit for negative output voltages. In this circumstance, the polarity of the transistors may be rearranged or switched accordingly. As another example, the aforementioned pumping transistors may include for example but not limited to other types of field effect transistors, such as JFET or depletion mode MOSFET and etc. As another example, other than voltage scaling circuit such as charge pump as described in the aforementioned embodiment, the present invention can also be employed to other circuits which includes multiple power domain, for example level shifters. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A voltage scaling-up circuit, comprising:
   a charge pump circuit which includes at least one pumping switch, and is configured to periodically store charges in at least one charge storage device therein according to an input voltage, and pumps the charges stored in the at least one charge storage device to a pumped voltage onto a pump output node through the at least one pumping switch, such that the magnitude of the pumped voltage is higher than the magnitude of the input voltage with a scaling factor, wherein each of the at least one pumping switch has a bulk; and a multiplexer circuit, configured to operably select one of a predetermined voltage and the pumped voltage which has a higher magnitude as a scaled output voltage at a scaled output node which is coupled to a first terminal of a scaled output capacitor;

wherein the bulk of the at least one pumping switch is connected to the scaled output node, such that the bulk of the at least one pumping switch is biased to the scaled output voltage.

2. The voltage scaling-up circuit of claim 1, wherein the multiplexer circuit includes a selection circuit and a comparison circuit, wherein the comparison circuit is configured to compare the predetermined voltage and the pumped voltage to generate a comparison result, and the selection circuit selects one of the predetermined voltage and the pumped voltage which has the higher magnitude as the scaled output voltage at the scaled output node according to the comparison result.

3. The voltage scaling-up circuit of claim 2, wherein the comparison circuit and the selection circuit include and share an operation device, wherein the comparison result of the comparison circuit is implied by an operation state of the operation device.

4. The voltage scaling-up circuit of claim 1,
wherein the charge pump circuit further includes a first charge storage device, a second charge storage device, a first charging transistor, and a second charging transistor, wherein each of the first and the second charging transistors includes a control terminal and a channel having a channel input terminal and a channel output terminal;

wherein the at least one pumping switch includes a first and a second pumping transistors, wherein each of the first and the second pumping transistors includes a control terminal, a channel having a channel input terminal and a channel output terminal, and a bulk;

wherein a first terminal of the first charge storage device is electrically connected to a first clock signal, and a first terminal of the second charge storage device is electrically connected to a second clock signal, and a second terminal of the first charge storage device is connected to a first pumping node at which a first charged voltage is presented, and a second terminal of the second charge storage device is connected to a second pumping node at which a second charged voltage is presented, and the channel input terminals of the first and the second charging transistors are electrically connected together to the input voltage, and the channel output terminals of the first and the second charging transistors are electrically connected to the first pumping node and the second pumping node respectively, and the control terminals of the first and the second charging transistors are electrically connected to the second pumping node and the first pumping node respectively;

wherein the channel output terminals of the first and the second pumping transistors are electrically connected together to the pump output node, and the channel input terminals of the first and the second pumping transistors are electrically connected to the first pumping node and the second pumping node respectively, and the control terminals of the first and the second pumping transistors are electrically connected to the second pumping node and the first pumping node respectively;

wherein the first and the second clock signals provide periodical pulsating voltages, and one of the channels of the first and the second charging transistors which has a higher control terminal voltage magnitude is conductive, such that the first and the second charged voltages are charged and pumped to pulsate between the input voltage level and the input voltage level plus the peak to peak level of the first and the second clock signals respectively, wherein the first and the second clock signals are substantially out of phase with each other, and the first and the second charged voltages correspondingly are substantially out of phase with each other;

wherein one of the channels of the first and the second pumping transistors which has a lower control terminal voltage magnitude is conductive, such that one of the first and the second charged voltages which has a higher magnitude is electrically connected to the pump output node through the conductive pumping transistor.

5. The voltage scaling-up circuit of claim 4, wherein the first charge storage device includes a capacitor or a MOS capacitor, and the second charge storage device includes a capacitor or a MOS capacitor.

6. The voltage scaling-up circuit of claim 4, wherein the peak to peak voltage levels of the first and the second clock signals have substantially the same magnitude as the input voltage.

7. The voltage scaling-up circuit of claim 1, wherein the predetermined voltage level is substantially the same as the input voltage level.

8. The voltage scaling-up circuit of claim 1, wherein the scaled output voltage is supplied to a load circuit, wherein the multiplexer circuit senses the predetermined voltage and the pumped voltage and selects one of the predetermined voltage and the pumped voltage which has a higher magnitude as the scaled output voltage to prevent a reverse current from flowing from the load circuit to the voltage scaling-up circuit through the scaled output voltage.

9. The voltage scaling-up circuit of claim 1, wherein each of the at least one pumping switch is a MOSFET.

10. A bulk biasing method for use in a charge pump circuit, the charge pump circuit including at least one pumping switch, configured to operably periodically store charge on at least one charge storage device according to an input voltage, and pump the charge stored in the at least one charge storage device to a pump output node through the at least one pumping switch, such that the magnitude of the pumped voltage is higher than the magnitude of the input voltage with a scaling factor, wherein each of the at least one pumping switch has a bulk;

the bulk biasing method comprising:
sensing a predetermined voltage and the pumped voltage;
selecting one of the predetermined voltage and the pumped voltage which has a higher magnitude as a scaled output voltage at a scaled output node; and
connecting a bulk of the at least one pumping switch to the scaled output node, such that the bulk of the at least one pumping switch is biased to the scaled output voltage.

* * * * *